US009905339B2

(12) United States Patent
Kawato et al.

(10) Patent No.: US 9,905,339 B2
(45) Date of Patent: Feb. 27, 2018

(54) CONDUCTIVE FILM FORMING METHOD AND SINTERING PROMOTER

(71) Applicant: ISHIHARA CHEMICAL CO., LTD., Hyogo (JP)

(72) Inventors: Yuichi Kawato, Hyogo (JP); Kazushige Miyamoto, Hyogo (JP); Yusuke Maeda, Hyogo (JP); Tomio Kudo, Hyogo (JP)

(73) Assignee: ISHIHARA CHEMICAL CO., LTD., Hyogo (JP)

( * ) Notice: Subject to any disclaimer, the term of this patent is extended or adjusted under 35 U.S.C. 154(b) by 0 days.

(21) Appl. No.: 14/384,003

(22) PCT Filed: Feb. 28, 2013

(86) PCT No.: PCT/JP2013/055417
§ 371 (c)(1),
(2) Date: Jan. 7, 2015

(87) PCT Pub. No.: WO2014/006934
PCT Pub. Date: Jan. 9, 2014

(65) Prior Publication Data
US 2015/0118413 A1    Apr. 30, 2015

(30) Foreign Application Priority Data

Jul. 3, 2012   (JP) .................... 2012-149014

(51) Int. Cl.
*H01B 13/00* (2006.01)
*C23C 18/12* (2006.01)
(Continued)

(52) U.S. Cl.
CPC ......... *H01B 13/003* (2013.01); *C09D 11/322* (2013.01); *C09D 11/52* (2013.01);
(Continued)

(58) Field of Classification Search
CPC .. C23C 18/1216; C23C 18/1295; C23C 18/14
(Continued)

(56) References Cited

U.S. PATENT DOCUMENTS 3,451,813 A * 6/1969 Kinney ................ H05K 3/106
174/256
4,560,643 A * 12/1985 Finter ................ C08G 85/004
427/304

(Continued)

FOREIGN PATENT DOCUMENTS

CN       101801674 A      8/2010
JP    2005-177710 A  *  7/2005
(Continued)

OTHER PUBLICATIONS

Complete machine translation of Gohara, JP 2005-177710 A, published Jul. 7, 2005.*

(Continued)

*Primary Examiner* — Marianne L Padgett
(74) *Attorney, Agent, or Firm* — Greenblum & Bernstein, P.L.C.

(57) ABSTRACT

In a conductive film forming method using photo sintering, a conductive film having low electric resistance is easily formed. Disclosed is a conductive film forming method in which a conductive film is formed using a photo sintering, which includes the steps of: forming a liquid film made of a copper particulate dispersion on a substrate, drying the liquid film to form a copper particulate layer, subjecting the copper particulate layer to photo sintering to form a conductive film, attaching a sintering promoter to the conductive film, and further subjecting the conductive film having the sintering promoter attached to photo sintering. The sintering promoter is a compound which removes copper oxide from metallic copper. Thereby, the sintering promoter (Continued)

removes a surface oxide film of copper particulates in the conductive film.

5 Claims, 1 Drawing Sheet

(51) Int. Cl.
  C23C 18/14 (2006.01)
  H05K 3/12 (2006.01)
  C09D 11/322 (2014.01)
  C09D 11/52 (2014.01)
  H01B 1/02 (2006.01)
  H01B 13/32 (2006.01)
  H05K 3/10 (2006.01)
(52) U.S. Cl.
  CPC ...... *C23C 18/1216* (2013.01); *C23C 18/1295* (2013.01); *C23C 18/14* (2013.01); *H01B 1/026* (2013.01); *H01B 13/322* (2013.01); *H05K 3/1283* (2013.01); *H05K 3/105* (2013.01); *H05K 2203/1131* (2013.01); *H05K 2203/1157* (2013.01); *H05K 2203/1476* (2013.01)
(58) Field of Classification Search
  USPC .......................................... 427/553, 554, 555
  See application file for complete search history.

(56) References Cited

U.S. PATENT DOCUMENTS

| | | | | |
|---|---|---|---|---|
| 5,100,693 | A * | 3/1992 | Eisch | C23C 18/14 427/123 |
| 6,951,666 | B2 * | 10/2005 | Kodas | C09D 11/30 257/E21.174 |
| 7,820,097 | B2 * | 10/2010 | Schroder | B82Y 30/00 419/45 |
| 9,120,944 | B2 * | 9/2015 | Kawato | H01B 1/026 |
| 9,318,233 | B2 * | 4/2016 | Son | H01B 1/22 |
| 9,615,455 | B2 * | 4/2017 | Kawato | H01B 1/026 |
| 2003/0146019 | A1 * | 8/2003 | Hirai | H05K 1/097 174/257 |
| 2005/0276933 | A1 * | 12/2005 | Prasad | H01L 21/288 428/1.1 |
| 2006/0057827 | A1 | 3/2006 | Huhtasalo et al. | |
| 2006/0154999 | A1 * | 7/2006 | Matsumoto | C08F 2/44 521/153 |
| 2006/0163744 | A1 * | 7/2006 | Vanheusden | B82Y 30/00 257/773 |
| 2008/0286488 | A1 * | 11/2008 | Li | B22F 1/0074 427/541 |
| 2010/0139943 | A1 * | 6/2010 | Abe | H01B 11/1817 174/107 |
| 2011/0267673 | A1 * | 11/2011 | Agrawal | G02F 1/155 359/267 |
| 2011/0297433 | A1 * | 12/2011 | Kuramoto | B23K 1/0016 174/263 |
| 2012/0009353 | A1 * | 1/2012 | Lee | B82Y 10/00 427/532 |
| 2012/0125659 | A1 * | 5/2012 | Nakako | C23C 18/1601 174/126.1 |
| 2012/0219703 | A1 | 8/2012 | Son et al. | |
| 2012/0260981 | A1 * | 10/2012 | Adachi | H01B 1/16 136/256 |
| 2014/0305791 | A1 * | 10/2014 | Ng | C23C 18/1612 204/157.41 |
| 2014/0367619 | A1 * | 12/2014 | Summers | H01B 1/22 252/512 |
| 2014/0370310 | A1 * | 12/2014 | Kawato | H01B 1/026 428/457 |
| 2015/0021071 | A1 * | 1/2015 | Kawato | H05K 3/386 174/257 |
| 2015/0024120 | A1 * | 1/2015 | Uchida | H01B 1/22 427/98.4 |
| 2015/0030784 | A1 * | 1/2015 | Kawato | B22F 3/10 427/559 |
| 2015/0147486 | A1 * | 5/2015 | Abed | H05K 1/097 427/559 |
| 2015/0225857 | A1 * | 8/2015 | Uchida | B41M 3/006 428/212 |
| 2016/0007455 | A1 * | 1/2016 | Kawato | H05K 1/092 428/457 |
| 2016/0029483 | A1 * | 1/2016 | Kawato | H05K 1/097 174/257 |
| 2016/0181217 | A1 * | 6/2016 | Prack | H01L 24/11 438/613 |
| 2017/0118836 | A1 * | 4/2017 | Kim | H05K 1/095 |

FOREIGN PATENT DOCUMENTS

| | | | |
|---|---|---|---|
| JP | 2010-528428 A | 8/2010 | |
| JP | 2010-239149 A | 10/2010 | |
| JP | 2011-252202 A | 12/2011 | |
| KR | 2011-0045230 A | 5/2011 | |
| KR | 2014-0082810 A * | 7/2017 | ............... H01B 1/22 |
| TW | 201114860 A | 5/2011 | |
| WO | 2010/032841 A1 | 3/2010 | |
| WO | 2010044904 A1 | 4/2010 | |
| WO | WO 2013/077448 A1 * | 5/2013 | ............... H01B 1/22 |

OTHER PUBLICATIONS

International search report issued with respect to application No. PCT/JP2013/055417, dated May 14, 2013.
Chinese Office Action issued with respect to Application No. 201380025632.7, dated Feb. 2, 2016.
Korean Office Action issued with respect to Application No. 2014-7027742, dated Feb. 29, 2016.
Office Action issued with respect to Taiwanese Patent Application No. 102123234, dated Mar. 5, 2015.

* cited by examiner

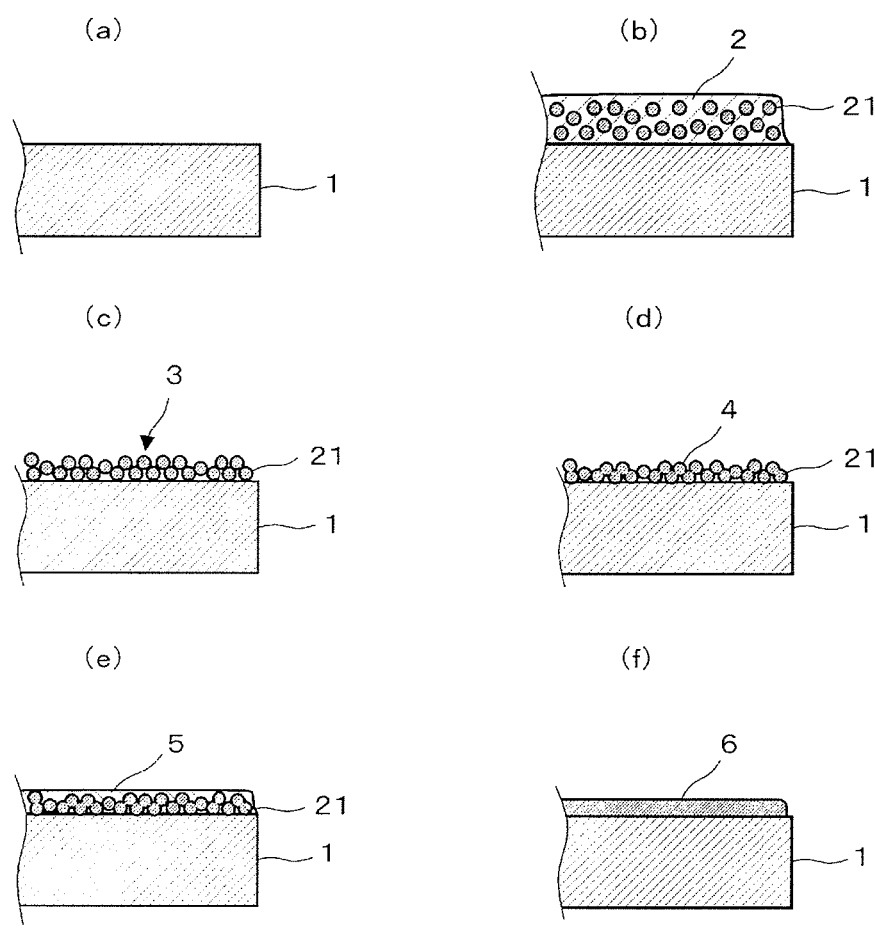

CONDUCTIVE FILM FORMING METHOD AND SINTERING PROMOTER

TECHNICAL FIELD

The present invention relates to a conductive film forming method using photo sintering, and a sintering promoter which allows photo sintering to proceed in the conductive film forming method.

BACKGROUND ART

There has hitherto existed a printed board in which a circuit composed of a copper foil is formed on a substrate by photolithography. Photolithography requires the step of etching a copper foil and high costs are required for a treatment of waste fluid generated by etching.

There has been known, as the technology requiring no etching, a method in which a conductive film is formed on a substrate using a copper particulate dispersion (copper ink) containing copper particulates (copper nanoparticles) dispersed in a dispersion vehicle (see, for example, Patent Document 1). According to this method, a liquid film of a copper particulate dispersion is formed on a substrate, and the liquid film is dried to form a copper particulate layer. The copper particulate layer undergoes photo sintering by irradiation with light, and thus a conductive film having low electric resistance is formed.

However, in the above-mentioned method, photo sintering may not sufficiently proceed even if energy of light irradiated in photo sintering is large, and thus failing to form a conductive film having low electric resistance.

PRIOR ART DOCUMENT

Patent Document 1: U.S. Patent Application Serial No. 2008/0286488

SUMMARY OF THE INVENTION

Problems to be Solved by the Invention

The present invention is made so as to solve the above-mentioned problems and an object thereof is to easily form a conductive film having low electric resistance in a conductive film forming method using photo sintering.

Means for Solving the Problems

A conductive film forming method of the present invention is a method in which a conductive film is formed using photo sintering, and is characterized by including the steps of: forming a liquid film made of a copper particulate dispersion on a substrate, drying the liquid film to form a copper particulate layer, subjecting the copper particulate layer to photo sintering to form a conductive film, attaching a sintering promoter to the conductive film, and further subjecting the conductive film having the sintering promoter attached to photo sintering, the sintering promoter being a compound which removes copper oxide from metallic copper.

In this conductive film forming method, the sintering promoter is preferably selected from the group consisting of amides, imides, ketones, urethanes, thioethers, carboxylic acids and phosphoric acids.

In this conductive film forming method, the sintering promoter is preferably selected from the group consisting of polyamic acid, polyvinylpyrrolidone, dimethylacetamide, dimethylformamide, a polyimide film, polyimide varnish, polyamideimide, acetylacetone, γ-butyrolactone, acetic acid, a low molecular weight unsaturated polycarboxylic acid polymer and a phosphoric acid ester.

In this conductive film forming method, the sintering promoter may be selected from the group consisting of alcohols, saccharides, aldehydes, hydrazines, quinones, phenols and amines.

In this conductive film forming method, the sintering promoter may be preferably selected from the group consisting of methanol, isopropyl alcohol, ethylene glycol, 3-methoxy-3-methylbutanol, diethylene glycol mono-2-ethylhexyl ether, polyethylene glycol, L-sorbitol, Kent paper, furfural, hydrazine, hydroquinone, hydroxybutyl anisole, hydroxylamine, triethanolamine and morpholine.

In this conductive film forming method, the sintering promoter is preferably applied on the conductive film in the step of attaching a sintering promoter to the conductive film.

In this conductive film forming method, the sintering promoter may be attached to the conductive film by irradiating with light in the step of attaching a sintering promoter to the conductive film.

A sintering promoter of the present invention is used in the above conductive film forming method.

Advantages of the Invention

According to the present invention, since a sintering promoter removes a surface oxide film of copper particulates in a conductive film in photo sintering after attaching the sintering promoter to the conductive film, copper particulates, from which the surface oxide film has been removed, are further sintered and thus a conductive film having low electric resistance is easily formed.

BRIEF DESCRIPTION OF THE DRAWINGS

FIGS. 1(a) to 1(f) are cross-sectional schematic views showing formation of a conductive film by a conductive film forming method according to an embodiment of the present invention in chronological order.

BEST MODE FOR CARRYING OUT THE INVENTION

A conductive film forming method according to an embodiment of the present invention will be described with reference to FIGS. 1(a) to 1(f). As shown in FIGS. 1(a) and 1(b), a liquid film 2 made of a copper particulate dispersion is formed on a substrate 1.

The substrate 1 is obtained by forming a base material into a plate shape. Examples of the base material include, but are not limited to, glass, a resin, ceramics, a silicon wafer and the like.

The copper particulate dispersion is a liquid containing copper particulates 21 dispersed therein, and includes copper particulates 21, a dispersion vehicle and a dispersant. Copper particulates 21 are, for example, copper nanoparticles having a median particle diameter of 1 nm or more and less than 100 nm. The dispersion vehicle is a liquid vehicle containing copper particulates 21. The dispersant enables copper particulates 21 to disperse in the dispersion vehicle. Copper particulates 21 are coated with a thin surface oxide film since a particle surface is oxidized by oxygen in air.

A liquid film 2 is formed, for example, by a printing method. In a printing method, a copper particulate dispersion is used as a printing ink, and a predetermined pattern is printed on a substrate 1 by a printing device and the liquid film 2 with the pattern is formed.

Next, the liquid film 2 is dried. As shown in FIG. 1(c), the copper particulates 21 remain on the substrate 1 by drying the liquid film 2 to form a copper particulate layer 3 composed of copper particulates 21 on the substrate 1.

Next, a copper particulate layer 3 is irradiated with light and undergoes photo sintering. As shown in FIG. 1(d), a conductive film 4 is formed by photo sintering of the copper particulate layer 3. Photo sintering is performed at room temperature under atmospheric air. A light source used in photo sintering is, for example, a xenon lamp. A laser device may be used as the light source. This photo sintering is performed to such a degree that, even if a liquid is applied on the conductive film 4, copper particulates 21 are not eluted in the liquid. Such photo sintering is performed under the conditions, for example, in which energy of light to be irradiated is within a range from 0.5 $J/cm^2$ to 30 $J/cm^2$, irradiation time is within a range from 0.1 ms to 10 ms, and the number of irradiation is one. In this photo sintering, the conductive film 4 does not sufficiently undergo bulking and thus electric resistance of the conductive film 4 does not become sufficiently low. The reason is considered that copper particulates 21, which are not sufficiently sintered, exist in the conductive film 4.

Next, as shown in FIG. 1 (e), a sintering promoter 5 is attached to the conductive film 4. Adhesion of the sintering promoter 5 to the conductive film 4 is also performed by applying the sintering promoter 5 on the conductive film 4. The sintering promoter 5 may be attached to the conductive film 4 by welding or vapor deposition through irradiation with light.

The sintering promoter 5 is a compound which removes copper oxide from metallic copper. The sintering promoter 5 are, for example, amides, imides, ketones, urethanes, thioethers, carboxylic acids or phosphoric acids. Examples of the sintering promoter 5 include, but are not limited to, amides such as polyamic acid, polyvinylpyrrolidone, dimethylacetamide and dimethylformamide; imides such as a polyimide film, polyimide varnish and polyamideimide; ketones such as acetylacetone and γ-butyrolactone; carboxylic acids such as acetic acid and a low molecular weight unsaturated polycarboxylic acid polymer; and phosphoric acids such as phosphoric acid ester. It is considered that such sintering promoter 5 removes copper oxide from metallic copper by etching.

The sintering promoter 5 may be alcohols, saccharides, aldehydes, hydrazines, quinones, phenols or amines. Examples of the sintering promoter 5 include, but are not limited to, alcohols such as methanol, isopropyl alcohol, ethylene glycol, 3-methoxy-3-methylbutanol, diethylene glycol mono-2-ethylhexyl ether and polyethylene glycol; saccharides such as L-sorbitol and Kent paper; aldehydes such as furfural; hydrazines such as hydrazine; quinones such as hydroquinone; phenols such as hydroxybutyl anisole; amines such as hydroxylamine, triethanolamine and morpholine. Such sintering promoter 5 removes copper oxide from metallic copper by reducing the copper oxide.

These sintering promoters 5 may be used alone, or two or more kinds of sintering promoters may be appropriately mixed and used.

Next, the conductive film 4 having the sintering promoter 5 attached is further subjected to photo sintering. As shown in FIG. 1 (f), the conductive film 4 sufficiently undergoes bulking to form a conductive film having low electric resistance 6 in this photo sintering.

It has hitherto been considered that the surface oxide film of copper particulates 21 is reduced to copper by a photoreduction reaction due to energy of light in photo sintering and then removed.

However, according to the test performed by the inventors of the present invention, the copper particulate layer may undergo insufficient bulking even if energy of light irradiated in photo sintering is large, depending on the copper particulate dispersion. Since too large energy of light irradiated on the copper particulate layer may cause damage of the copper particulate layer, there is a limitation on magnitude of energy of light irradiated in photo sintering. The inventors of the present invention considered that there may be some cases where the surface oxide film of copper particulates 21 is not sufficiently removed only by energy of light, and thus photo sintering does not sufficiently proceed, leading to insufficient bulking of the copper particulate layer.

The inventors of the present invention have found by the test that use of a compound, which removes copper oxide from metallic copper, enables proceeding of photo sintering. In a conductive film forming method of the present embodiment, a sintering promoter 5 is a compound which removes copper oxide from metallic copper, and removes a surface oxide film of copper particulates 21 which exist in a conductive film 4 without being sufficiently sintered. A chemical reaction, in which the sintering promoter 5 removes copper oxide from copper particulates 21, is promoted by irradiation with light to the conductive film 4 having the sintering promoter 5 attached. In photo sintering after attaching the sintering promoter 5 to the conductive film 4, a copper particulates 21, from which a surface oxide film has been removed, is sintered by energy of light, and thus the conductive film 4 undergoes bulking to form a conductive film 6 having low electric resistance.

As mentioned above, according to a conductive film forming method of the present embodiment, in photo sintering after attaching the sintering promoter 5 to the conductive film 4, since the sintering promoter 5 removes a surface oxide film of copper particulates 21 in the conductive film 4, copper particulates 21, from which the surface oxide film has been removed, are further sintered and a conductive film 6 having low electric resistance is easily formed.

In case the sintering promoter 5 enables etching of copper oxide, the surface oxide film of copper particulates 21 is removed by etching.

In case the sintering promoter 5 enables reduction of copper oxide, the surface oxide film of copper particulates 21 is removed by reduction.

In Examples, using a conductive film forming method of the present invention, a conductive film 6 was formed and electric resistance of the thus formed conductive film 6 was measured.

Example 1

A non-alkali glass was used as a substrate 1. A copper particulate dispersion (manufactured by ISHIHARA CHEMICAL CO., LTD. under the trade name of "CJ-0104") was applied on the substrate 1 in a predetermined thickness by a spin coating method. The substrate 1 coated with the copper particulate dispersion was dried under atmospheric air at 100° C. for 30 minutes, and then subjected to photo sintering using a flash irradiation device with a xenon lamp. Light irradiation in this photo sintering was carried out at magnitude of energy within a range from 0.5 $J/cm^2$ to 30 $J/cm^2$ for 0.1 ms to 10 ms under the condition that a conductive film 4 having sheet resistance of about 1,000 mΩ/□ can be obtained by single irradiation. The thus obtained conductive film 4 has a black surface and is incompletely sintered. However, application of a liquid on the film does not cause any elution of copper particulates 21 in the liquid. Next, using methanol among alcohols as a sintering promoter 5, the sintering promoter 5 was applied on the conductive film 4 and second photo sintering was performed to produce a test substrate. Light irradiation in the second photo sintering was carried out at magnitude of energy within a range from 0.5 J/cm$^2$ to 30 J/cm$^2$ for 0.1 ms to 10 ms, and light having energy larger than that in the first photo sintering was irradiated. After the second photo sintering, the surface of the conductive film 4 changed color to a copper color. The copper color is the color of bulk copper, and it was found from the change in color due to photo sintering that the conductive film 4 underwent bulking to form a conductive film 6 on the test substrate. Sheet resistance of the conductive film 6 showed a low value of 170 mΩ/□.

Example 2

Isopropyl alcohol among alcohols was used as the sintering promoter 5. In the same manner as in Example 1, except for that mentioned above, a test substrate was produced. The surface of the conductive film 6 formed on the test substrate showed a copper color. Sheet resistance of the conductive film 6 showed a low value of 280 mΩ/□.

Example 3

Ethylene glycol among alcohols was used as the sintering promoter 5. In the same manner as in Example 2, except for that mentioned above, a test substrate was produced. The surface of the conductive film 6 formed on the test substrate showed a copper color. Sheet resistance of the conductive film 6 showed a low value of 440 mΩ/□.

Example 4

3-Methoxy-3-methylbutanol among alcohols was used as the sintering promoter 5. In the same manner as in Example 3, except for that mentioned above, a test substrate was produced. The surface of the conductive film 6 formed on the test substrate showed a copper color. Sheet resistance of the conductive film 6 showed a low value of 160 mΩ/□.

Example 5

Diethylene glycol mono-2-ethylhexyl ether among alcohols was used as the sintering promoter 5. In the same manner as in Example 4, except for that mentioned above, a test substrate was produced. The surface of the conductive film 6 formed on the test substrate showed a copper color. Sheet resistance of the conductive film 6 showed a low value of 160 mΩ/□.

Example 6

Polyethylene glycol (having a molecular weight of 600) among alcohols was used as the sintering promoter 5. In the same manner as in Example 5, except for that mentioned above, a test substrate was produced. The surface of the conductive film 6 formed on the test substrate showed a copper color. Sheet resistance of the conductive film 6 showed a low value of 260 mΩ/□.

Example 7

Furfural (furan-2-carbaldehyde) among aldehydes was used as the sintering promoter 5. In the same manner as in Example 6, except for that mentioned above, a test substrate was produced. The surface of the conductive film 6 formed on the test substrate showed a copper color. Sheet resistance of the conductive film 6 showed a low value of 300 mΩ/□.

Example 8

Dimethylacetamide among amides was used as the sintering promoter 5. In the same manner as in Example 7, except for that mentioned above, a test substrate was produced. The surface of the conductive film 6 formed on the test substrate showed a copper color. Sheet resistance of the conductive film 6 showed a low value of 280 mΩ/□.

Example 9

Dimethylformamide among amides was used as the sintering promoter 5. In the same manner as in Example 8, except for that mentioned above, a test substrate was produced. The surface of the conductive film 6 formed on the test substrate showed a copper color. Sheet resistance of the conductive film 6 showed a low value of 280 mΩ/□.

Example 10

Acetylacetone among ketones was used as the sintering promoter 5. In the same manner as in Example 9, except for that mentioned above, a test substrate was produced. The surface of the conductive film 6 formed on the test substrate showed a copper color. Sheet resistance of the conductive film 6 showed a low value of 350 mΩ/□.

Example 11

γ-Butyrolactone among ketones was used as the sintering promoter 5. In the same manner as in Example 10, except for that mentioned above, a test substrate was produced. The surface of the conductive film 6 formed on the test substrate showed a copper color. Sheet resistance of the conductive film 6 showed a low value of 400 mΩ/□.

Example 12

Acetic acid among carboxylic acids was used as the sintering promoter 5. In the same manner as in Example 11, except for that mentioned above, a test substrate was produced. The surface of the conductive film 6 formed on the test substrate showed a copper color. Sheet resistance of the conductive film 6 showed a low value of 200 mΩ/□.

Example 13

Using L-sorbitol among saccharides as the sintering promoter 5 and using propylene carbonate as the solvent, a solution containing the sintering promoter was prepared. The concentration of the sintering promoter 5 was adjusted to 1 mol/L (M). The sintering promoter 5 was attached to a conductive film 4 by applying this solution on the conductive film 4, and then the second photo sintering was performed. In the same manner as in Example 12, except for

Example 14

Using hydrazine among hydrazines as the promoter 5 and using propylene carbonate as the solvent, a solution containing the sintering promoter 5 was prepared. The concentration of the sintering promoter 5 was adjusted to 1 mol/L. In the same manner as in Example 13, except for that mentioned above, a test substrate was produced. The surface of the conductive film 6 formed on the test substrate showed a copper color. Sheet resistance of the conductive film 6 showed a low value of 180 mΩ/□.

Example 15

Using hydroquinone among quinones as the sintering promoter 5 and using propylene carbonate as the solvent, a solution containing the sintering promoter 5 was prepared. The concentration of the sintering promoter 5 was adjusted to 1 mol/L. In the same manner as in Example 14, except for that mentioned above, a test substrate was produced. The surface of the conductive film 6 formed on the test substrate showed a copper color. Sheet resistance of the conductive film 6 showed a low value of 260 mΩ/□.

Example 16

Using hydroxybutyl anisole among phenols as the sintering promoter 5 and using propylene carbonate as the solvent, a solution containing the sintering promoter 5 was prepared. The concentration of the sintering promoter 5 was adjusted to 1 mol/L. In the same manner as in Example 15, except for that mentioned above, a test substrate was produced. The surface of the conductive film 6 formed on the test substrate showed a copper color. Sheet resistance of the conductive film 6 showed a low value of 280 mΩ/□.

Example 17

Using hydroxylamine among amines as the sintering promoter 5 and using propylene carbonate as the solvent, a solution containing the sintering promoter 5 was prepared. The concentration of the sintering promoter 5 was adjusted to 1 mol/L. In the same manner as in Example 16, except for that mentioned above, a test substrate was produced. The surface of the conductive film 6 formed on the test substrate showed a copper color. Sheet resistance of the conductive film 6 showed a low value of 170 mΩ/□.

Example 18

Using triethanolamine among amines as the sintering promoter 5 and using propylene carbonate as the solvent, a solution containing the sintering promoter 5 was prepared. The concentration of the sintering promoter 5 was adjusted to 1 mol/L. In the same manner as in Example 17, except for that mentioned above, a test substrate was produced. The surface of the conductive film 6 formed on the test substrate showed a copper color. Sheet resistance of the conductive film 6 showed a low value of 170 mΩ/□.

Example 19

Using morpholine among amines as the sintering promoter 5 and using propylene carbonate as the solvent, a solution containing the sintering promoter 5 was prepared. The concentration of the sintering promoter 5 was adjusted to 1 mol/L. In the same manner as in Example 18, except for that mentioned above, a test substrate was produced. The surface of the conductive film 6 formed on the test substrate showed a copper color. Sheet resistance of the conductive film 6 showed a low value of 200 mΩ/□.

Example 20

Using polyamic acid among amides as the sintering promoter 5 and using propylene carbonate as the solvent, a solution containing the sintering promoter 5 was prepared. The concentration of the sintering promoter 5 was adjusted to 1%. In the same manner as in Example 19, except for that mentioned above, a test substrate was produced. The surface of the conductive film 6 formed on the test substrate showed a copper color. Sheet resistance of the conductive film 6 showed a low value of 280 mΩ/□.

Example 21

Using polyvinylpyrrolidone (having a molecular weight of 630,000) among amides as the sintering promoter 5 and using propylene carbonate as the solvent, a solution containing the sintering promoter 5 was prepared. The concentration of the sintering promoter 5 was adjusted to 1 mol/L. In the same manner as in Example 20, except for that mentioned above, a test substrate was produced. The surface of the conductive film 6 formed on the test substrate showed a copper color. Sheet resistance of the conductive film 6 showed a low value of 160 mΩ/□.

Example 22

Using polyimide varnish (N-methyl-2-pyrrolidone solution) among imides as the sintering promoter 5 and using propylene carbonate as the solvent, a solution containing the sintering promoter 5 was prepared. The concentration of the sintering promoter 5 was adjusted to 1%. In the same manner as in Example 21, except for that mentioned above, a test substrate was produced. The surface of the conductive film 6 formed on the test substrate showed a copper color. Sheet resistance of the conductive film 6 showed a low value of 300 mΩ/□.

Example 23

Using a polyamideimide resin among imides as the sintering promoter 5 and using propylene carbonate as the solvent, a solution containing the sintering promoter 5 was prepared. The concentration of the sintering promoter 5 was adjusted to 1%. In the same manner as in Example 22, except for that mentioned above, a test substrate was produced. The surface of the conductive film 6 formed on the test substrate showed a copper color. Sheet resistance of the conductive film 6 showed a low value of 300 mΩ/□.

Example 24

Using a polymer of a low molecular weight unsaturated carboxylic acid (manufactured by BYK-Chemie Inc. under the trade name of "DISPERBYK (registered trademark)-P-105") among carboxylic acids as the sintering promoter 5 and using propylene carbonate as the solvent, a solution containing the sintering promoter 5 was prepared. The concentration of the sintering promoter 5 was adjusted to 1%. In the same manner as in Example 23, except for that mentioned above, a test substrate was produced. The surface of the conductive film 6 formed on the test substrate showed a copper color. Sheet resistance of the conductive film 6 showed a low value of 280 mΩ/□.

Example 25

Using phosphoric acid ester (manufactured by BYK-Chemie Inc. under the trade name of "DISPERBYK (registered trademark)-111") among phosphoric acids as the sintering promoter 5 and using propylene carbonate as the solvent, a solution containing the sintering promoter 5 was prepared. The concentration of the sintering promoter 5 was adjusted to 1%. In the same manner as in Example 24, except for that mentioned above, a test substrate was produced. The surface of the conductive film 6 formed on the test substrate showed a copper color. Sheet resistance of the conductive film 6 showed a low value of 240 mΩ/□.

Example 26

Using polyoxyethylenetridecyl etherphosphoric acid ester (manufactured by DAI-ICHI KOGYO SEIYAKU CO., LTD. under the trade name of "PLYSURF (registered trademark) A212C") among phosphoric acids as the sintering promoter 5 and using propylene carbonate as the solvent, a solution containing the sintering promoter 5 was prepared. The concentration of the sintering promoter 5 was adjusted to 1%. In the same manner as in Example 25, except for that mentioned above, a test substrate was produced. The surface of the conductive film 6 formed on the test substrate showed a copper color. Sheet resistance of the conductive film 6 showed a low value of 400 mΩ/□.

Example 27

Using polyoxyethylene lauryl ether phosphoric acid ester (manufactured by DAI-ICHI KOGYO SEIYAKU CO., LTD. under the trade name of "PLYSURF (registered trademark) A208B") among phosphoric acids as the sintering promoter 5 and using propylene carbonate as the solvent, a solution containing the sintering promoter 5 was prepared. The concentration of the sintering promoter 5 was adjusted to 1%. In the same manner as in Example 25, except for that mentioned above, a test substrate was produced. The surface of the conductive film 6 formed on the test substrate showed a copper color. Sheet resistance of the conductive film 6 showed a low value of 400 mΩ/□.

Example 28

A slide glass was used as the substrate 1. In the same manner as in Example 2, except for that mentioned above, a test substrate was produced. That is, isopropyl alcohol among alcohols was used as the sintering promoter 5. The surface of the conductive film 6 formed on the test substrate showed a copper color. Sheet resistance of the conductive film 6 showed a low value of 280 mΩ/□.

Example 29

Alumina (ceramic) was used as the substrate 1. In the same manner as in Example 28, except for that mentioned above, a test substrate was produced. The surface of the conductive film 6 formed on the test substrate showed a copper color. Sheet resistance of the conductive film 6 showed a low value of 280 mΩ/□.

Example 30

An aluminum foil was used as the substrate 1. In the same manner as in Example 29, except for that mentioned above, a test substrate was produced. The surface of the conductive film 6 formed on the test substrate showed a copper color. Sheet resistance of the conductive film 6 showed a low value of 500 mΩ/□.

Example 31

A stainless steel foil was used as the substrate 1. In the same manner as in Example 30, except for that mentioned above, a test substrate was produced. The surface of the conductive film 6 formed on the test substrate showed a copper color. Sheet resistance of the conductive film 6 showed a low value of 500 mΩ/□.

Example 32

A silicon wafer was used as the substrate 1. In the same manner as in Example 31, except for that mentioned above, a test substrate was produced. The surface of the conductive film 6 formed on the test substrate showed a copper color. Sheet resistance of the conductive film 6 showed a low value of 200 mΩ/□.

Example 33

A slide glass was used as the substrate 1. A polyimide film (manufactured by Du Pont-Toray Co., Ltd. under the trade name of "Kapton (registered trademark) 200EN") among imides was used as the sintering promoter 5. In the second photo sintering, a conductive film 4 was irradiated with light having energy larger than normal energy through a mask of a polyimide film, which is the sintering promoter 5, to produce a test substrate. That is, the sintering promoter 5 was attached to the conductive film 4 by irradiating the sintering promoter 5 with light. In the same manner as in Example 1, except for that mentioned above, a test substrate was produced. The surface of the conductive film 6 formed on the test substrate showed a copper color. Sheet resistance of the conductive film 6 showed a low value of 500 mΩ/□.

Example 34

A silicon wafer was used as the substrate 1. Kent paper among saccharides was used as the sintering promoter 5. In the second photo sintering, Kent paper as the sintering promoter 5 was disposed in the vicinity of a conductive film 4, followed by irradiation with light having energy larger than normal energy to produce a test substrate. That is, the sintering promoter 5 was attached to the conductive film 4 by irradiating the sintering promoter 5 with light. In the same manner as in Example 33, except for that mentioned above, a test substrate was produced. The surface of the conductive film 6 formed on the test substrate showed a copper color. Sheet resistance of the conductive film 6 showed a low value of 500 mΩ/□.

In Comparative Examples, a conductive film was formed by using a compound, which does not remove copper oxide from metallic copper, instead of the sintering promoter 5, and then electric resistance of the thus formed conductive film was measured.

Comparative Example 1

Propylene carbonate was used instead of the sintering promoter 5. In the same manner as in Example 1, except for that mentioned above, a test substrate was produced. The conductive film formed on the test substrate had a black surface. Sheet resistance of the conductive film showed a high value of 1,000 mΩ/☐.

Comparative Example 2 n-Hexane was used instead of the sintering promoter 5. In the same manner as in Example 1, except for that mentioned above, a test substrate was produced. The conductive film formed on the test substrate had a black surface. Sheet resistance of the conductive film showed a high value of 1,000 mΩ/☐.

Comparative Example 3

Xylene was used instead of the sintering promoter 5. In the same manner as in Example 1, except for that mentioned above, a test substrate was produced. The conductive film formed on the test substrate had a black surface. Sheet resistance of the conductive film showed a high value of 1,000 mΩ/☐.

Comparative Example 4

Liquid paraffin was used instead of the sintering promoter 5. In the same manner as in Example 1, except for that mentioned above, a test substrate was produced. The conductive film formed on the test substrate had a black surface. Sheet resistance of the conductive film showed a high value of 1,000 mΩ/☐.

Comparative Example 5

Diethylene glycol dibutyl ether was used instead of the sintering promoter 5. In the same manner as in Example 1, except for that mentioned above, a test substrate was produced. The conductive film formed on the test substrate had a black surface. Sheet resistance of the conductive film showed a high value of 1,000 mΩ/☐.

Comparative Example 6

Diglyme (bis(2-methoxyethyl)ether) was used instead of the sintering promoter 5. In the same manner as in Example 1, except for that mentioned above, a test substrate was produced. The conductive film formed on the test substrate had a black surface. Sheet resistance of the conductive film showed a high value of 1,000 mΩ/☐.

Comparative Example 7

Distilled water was used instead of the sintering promoter 5. In the same manner as in Example 1, except for that mentioned above, a test substrate was produced. The conductive film formed on the test substrate had a black surface. Sheet resistance of the conductive film showed a high value of 1,000 mΩ/☐.

Comparative Example 8

PET (polyethylene terephthalate) film was used instead of the sintering promoter 5. In the same manner as in Example 33, except for that mentioned above, a test substrate was produced. PET was attached to a conductive film 4 by irradiating a PET film with light. The conductive film formed on the test substrate had a black surface. Sheet resistance of the conductive film showed a high value of 1,000 mΩ/☐.

As mentioned above, use of the sintering promoter 5 enables the formation of a conductive film 6 having low electric resistance. When using a compound, which does not remove copper oxide from metallic copper, instead of the sintering promoter 5, the thus formed conductive film showed high electric resistance.

The present invention is not limited to configurations of the above-mentioned embodiments, and various modifications can be made without departing from the spirit or scope of the present invention. For example, the surface shape of the substrate 1 is not limited to a plane and may be a curved surface of a combination of a plurality of planes.

EXPLANATION OF SYMBOLS

1: Substrate
2: Liquid film
21: Copper particulates
3: Copper particulate layer
4: Conductive film
5: Sintering promoter
6: Conductive film

The invention claimed is:

1. A conductive film forming method in which a conductive film is formed using photo sintering, which comprises:
   forming a liquid film made of a copper particulate dispersion on a substrate,
   drying the liquid film to form a copper particulate layer,
   subjecting the copper particulate layer to photo sintering to form a formed conductive film, and subsequently
   depositing only a sintering promoter or only a sulfated sintering promoter directly onto the formed conductive film, and
   further subjecting the formed conductive film having the sintering promoter deposited thereon to photo sintering, wherein
   the sintering promoter is a compound which removes copper oxide from metallic copper.

2. The conductive film forming method according to claim 1, wherein the sintering promoter is selected from the group consisting of amides, imides, ketones, urethanes, thioethers, carboxylic acids and phosphoric acids.

3. The conductive film forming method according to claim 2, wherein the sintering promoter is selected from the group consisting of polyamic acid, polyvinylpyrrolidone, dimethylacetamide, dimethylformamide, a polyimide film, polyimide varnish, polyamideimide, acetylacetone, γ-butyrolactone, acetic acid and a phosphoric acid ester.

4. The conductive film forming method according to claim 1, wherein the sintering promoter is selected from the group consisting of alcohols, saccharides, aldehydes, hydrazines, quinones, phenols and amines.

5. The conductive film forming method according to claim 4, wherein the sintering promoter is selected from the group consisting of methanol, isopropyl alcohol, ethylene glycol, 3-methoxy-3-methylbutanol, diethylene glycol mono-2-ethylhexyl ether, polyethylene glycol, L-sorbitol, furfural, hydrazine, hydroquinone, hydroxybutyl anisole, hydroxylamine, triethanolamine and morpholine.

* * * * *